(12) United States Patent
Dubois et al.

(10) Patent No.: US 7,931,829 B2
(45) Date of Patent: Apr. 26, 2011

(54) LOW-K INTERLEVEL DIELECTRIC MATERIALS AND METHOD OF FORMING LOW-K INTERLEVEL DIELECTRIC LAYERS AND STRUCTURES

(75) Inventors: Geraud Jean-Michel Dubois, Los Gatos, CA (US); James Lupton Hedrick, Pleasanton, CA (US); Ho-Cheol Kim, San Jose, CA (US); Victor Yee-Way Lee, San Jose, CA (US); Teddie Peregrino Magbitang, San Jose, CA (US); Robert Dennis Miller, San Jose, CA (US); Muthumanickam Sankarapandian, Niskayuna, NY (US); Linda Karin Sundberg, Los Gatos, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/857,633

(22) Filed: Aug. 17, 2010

(65) Prior Publication Data

US 2010/0311895 A1 Dec. 9, 2010

Related U.S. Application Data

(60) Division of application No. 12/053,721, filed on Mar. 24, 2008, now Pat. No. 7,820,242, which is a continuation of application No. 11/190,644, filed on Jul. 27, 2005, now Pat. No. 7,459,183.

(51) Int. Cl.
*H01B 1/12* (2006.01)

(52) U.S. Cl. .................... 252/519.33; 427/226

(58) Field of Classification Search .................. 427/226; 252/519.33

See application file for complete search history.

(56) References Cited

U.S. PATENT DOCUMENTS

| 5,895,263 | A | 4/1999 | Carter et al. |
| 6,093,636 | A | 7/2000 | Carter et al. |

(Continued)

FOREIGN PATENT DOCUMENTS

JP 2002003683 1/2002

OTHER PUBLICATIONS

Kim et al.; Fabrication of Multilayered Nanapourous Poly(methyl silsesquioxane); Advanced Materials 2002; vol. 14, No. 22, Nov. 18; pp. 1637-1639.

(Continued)

*Primary Examiner* — David Turocy
*Assistant Examiner* — Robert Vetere
(74) *Attorney, Agent, or Firm* — Schmeiser, Olsen & Watts (57) ABSTRACT

A composition of matter and a structure fabricated using the composition. The composition comprising: a resin; polymeric nano-particles dispersed in the resin, each of the polymeric nano-particle comprising a multi-arm core polymer and pendent polymers attached to the multi-arm core polymer, the multi-arm core polymer immiscible with the resin and the pendent polymers miscible with the resin; and a solvent, the solvent volatile at a first temperature, the resin cross-linkable at a second temperature, the polymeric nano-particle decomposable at a third temperature, the third temperature higher than the second temperature, the second temperature higher than the first temperature, wherein a thickness of a layer of the composition shrinks by less than about 3.5% between heating the layer from the second temperature to the third temperature.

20 Claims, 7 Drawing Sheets

U.S. PATENT DOCUMENTS

| | | | |
|---|---|---|---|
| 6,333,141 B1 * | 12/2001 | Carter et al. | 430/314 |
| 6,630,520 B1 * | 10/2003 | Bruza et al. | 521/77 |
| 6,667,147 B2 * | 12/2003 | Gallagher et al. | 430/311 |
| 7,459,183 B2 | 12/2008 | Dubois et al. | |
| 2003/0059723 A1 | 3/2003 | Gallagher et al. | |
| 2003/0168251 A1 | 9/2003 | Hawker et al. | |
| 2003/0186168 A1 | 10/2003 | Gallagher et al. | |
| 2003/0186169 A1 | 10/2003 | Gallagher et al. | |
| 2004/0053033 A1 | 3/2004 | Niu et al. | |
| 2004/0137241 A1 | 7/2004 | Lin et al. | |
| 2004/0137243 A1 | 7/2004 | Gleason et al. | |
| 2004/0161922 A1 | 8/2004 | Gallagher et al. | |
| 2004/0191417 A1 | 9/2004 | Yontz et al. | |
| 2004/0213911 A1 | 10/2004 | Misawa et al. | |
| 2005/0070124 A1 | 3/2005 | Miller et al. | |
| 2006/0142504 A1 | 6/2006 | Ree et al. | |

OTHER PUBLICATIONS

Calvert et al.; A New Approach to Ultralow-k Dielectrics; Semiconductor International; Nov. 2003; pp. 56-60.

Notice of Allowance (Mail Date Jun. 22, 2010) for U.S. Appl. No. 12/053,721, filed Mar. 24, 2008; Confirmation No. 4819.

* cited by examiner

LOW-K INTERLEVEL DIELECTRIC MATERIALS AND METHOD OF FORMING LOW-K INTERLEVEL DIELECTRIC LAYERS AND STRUCTURES

This application is a division of U.S. patent application Ser. No. 12/053,721 filed on Mar. 24, 2008, now U.S. Pat. No. 7,820,242 issued on Oct. 26, 2010 which is a continuation of U.S. patent application Ser. No. 11/190,644 filed on Jul. 27, 2005, now U.S. Pat. No. 7,459,183 issued Dec. 2, 2008.

FIELD OF THE INVENTION

The present invention relates to the field of porous interlevel dielectric materials used in the fabrication of integrated circuits and methods of fabricating integrated circuits having porous interlevel dielectric layers.

BACKGROUND OF THE INVENTION

As electronic devices become smaller, there is a continuing desire in the electronics industry to increase the circuit density in electronic components, e.g., integrated circuits, circuit boards, multi-chip modules, chip test devices, and the like, without degrading electrical performance, e.g., without introducing cross-talk capacitive coupling between wires while at the same time increasing speed or signal propagation of these components. One method for accomplishing these goals is to reduce the dielectric constant of the dielectric material in which the wires are embedded. Toward this end, a new class of low dielectric constant (low K) materials have been created. However, as the density of integrated circuits continues to increase, there is a continuing need for insulating materials with ever lower dielectric constants.

SUMMARY OF THE INVENTION

A first aspect of the present invention is a composition, comprising: a resin; polymeric nano-particles dispersed in the resin, each of the polymeric nano-particles comprising a multi-arm core polymer and pendent polymers attached to the multi-arm core polymer, the multi-arm core polymer immiscible with the resin and the pendent polymers miscible with the resin; and a solvent, the solvent volatile at a first temperature, the resin cross-linkable at a second temperature, the polymeric nano-particle decomposable at a third temperature, the third temperature higher than the second temperature, the second temperature higher than the first temperature, wherein a thickness of a layer of the composition shrinks by less than about 3.5% between heating the layer from the second temperature to the third temperature.

A second aspect of the present invention is a method, comprising: forming a precursor layer on a substrate, the precursor layer including a resin, polymeric nano-particles dispersed in the resin, and a solvent, each of the polymeric nano-particles comprising a multi-arm core polymer and pendent polymers attached to the multi-arm core polymer, the multi-arm core polymer immiscible with the resin and the pendent polymers miscible with the resin; heating the precursor layer to a first temperature, the first temperature high enough to drive the solvent out of the precursor layer without decomposing more than about 0.5% the polymeric nano-particles, to form a pre-baked precursor layer; heating the pre-baked precursor layer to a second temperature, the second temperature high enough to cross-link at least about 90% of the resin without decomposing more than about 5% of the polymeric nano-particles, thereby converting the pre-baked precursor layer to a dielectric layer, the second temperature higher than the first temperature; and heating the dielectric layer to a third temperature, the third temperature high enough to thermally decompose at least about 99.5% of the polymeric nano-particles into decomposition products and to drive the decomposition products out of the dielectric layer, thereby creating voids in the dielectric layer and converting the dielectric layer to a porous dielectric layer, the third temperature higher than the second temperature.

A third aspect of the present invention is a method comprising: forming a precursor layer on a substrate, the precursor layer including a resin, polymeric nano-particles dispersed in the resin, and a solvent, each of the polymeric nano-particles comprising a multi-arm core polymer and pendent polymers attached to the multi-arm core polymer, the multi-arm core polymer immiscible with the resin and the pendent polymers miscible with the resin; heating the precursor layer to a first temperature, the first temperature high enough to drive the solvent out of the precursor layer without decomposing more than about 0.5% the polymeric nano-particles, to form a pre-baked precursor layer; heating the pre-baked precursor layer to a second temperature, the second temperature high enough to cross-link at least about 90% of the resin without decomposing more than about 5% of the polymeric nano-particles, thereby converting the pre-baked precursor layer to a dielectric layer, the second temperature higher than the first temperature; forming trenches in the dielectric layer after the heating to the second temperature and filling the trenches with an electrical conductor; and heating the dielectric layer to a third temperature, the third temperature high enough to thermally decompose at least about 99.5% of the polymeric nano-particles into volatile decomposition products and to drive the decomposition products out of the dielectric layer, thereby creating voids in the dielectric layer and converting the dielectric layer to a porous dielectric layer, the third temperature higher than the second temperature, wherein a thickness of the porous dielectric layer after the heating to the third temperature is within about 2% of a thickness of the dielectric layer after the heating to the second temperature, wherein the dielectric layer has a Young's modulus of at least about 3.6 GPa, and wherein the porous dielectric layer has a permittivity of 2.4 or less and a Young's modulus of at least about 0.8 GPa.

BRIEF DESCRIPTION OF DRAWINGS

The features of the invention are set forth in the appended claims. The invention itself, however, will be best understood by reference to the following detailed description of illustrative embodiments when read in conjunction with the accompanying drawings, wherein:

DETAILED DESCRIPTION OF THE INVENTION

A porogen is a material which when dispersed in a layer of another material will generate pores or voids in the layer. In one example, the pores or voids may be filled with air or another gas. The permittivity of a porous material may be modeled using Bruggeman or Looyenga approximations. In one example, a low K dielectric layer is a layer having a permittivity of about 2.4 or less. The porogens according to the embodiments of the present invention are polymeric nano-particles and unless stated otherwise, the term porogen as used hereinafter means a polymeric nano-particle.

A thermosetting resin is a polymer that is irreversibly cross-linked by heat. A star molecule is a molecule with a branching or multi-arm core and has multiple polymer chain branches extending from the core.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planer with the surface of the dielectric layer to form damascene wires (or damascene vias). When only a trench and a wire (or a via opening and a via) are formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface of the dielectric layer to form dual-damascene wires and dual-damascene wires having integral dual-damascene vias. Alternatively, trenches may be formed first and then vias formed in the bottom of the trenches.

Figure 1A:
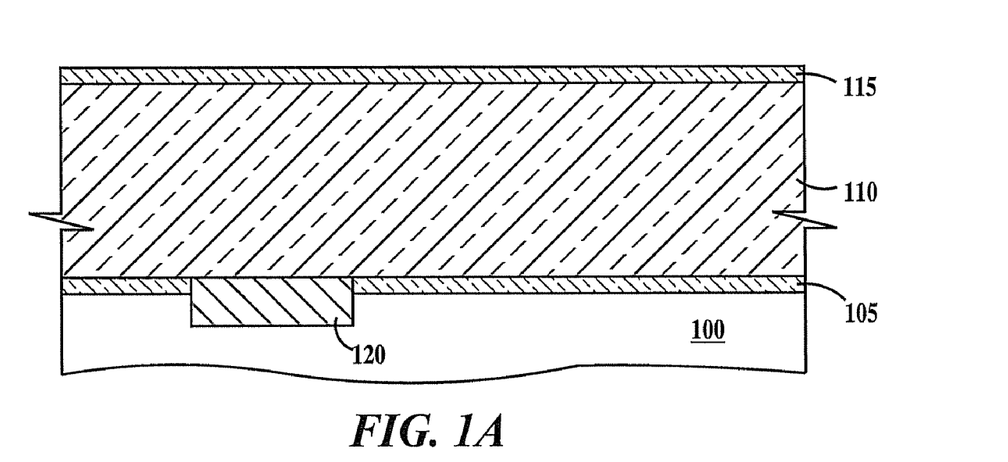
FIGS. 1A through 1F are cross-section views illustrating fabrication of an interlevel dielectric wiring level in an integrated circuit according to a first embodiment of the present invention.

FIGS. 1A through 1F are cross-section views illustrating fabrication of an interlevel dielectric wiring level in an integrated circuit according to a first embodiment the present invention. In FIG. 1A, formed on a top surface of a substrate 100 is a barrier layer 105. Formed on a top surface of barrier layer 105 is a dielectric layer 110. Dielectric layer 110 comprises a mixture of cured (cross-linked) matrix and porogen polymeric nano-particles, hereinafter polymeric nano-particles. The polymeric nano-particles may advantageously have a maximum dimension of about 50 nm or less. The composition of and method of preparing the composition used to form dielectric layer 110 is described infra.

Dielectric layer 110 may be formed, for example, by (1) spin application of a mixture of a casting solvent, uncured resin (not cross-linked to the extent that is it not soluble in the casting solvent) and polymeric nano-particles to form a precursor dielectric layer; (2) pre-baking the mixture of casting solvent, uncured resin and polymeric nano-particles to a sufficiently high enough temperature to drive out most (i.e., about 99%) if not all of the casting solvent without significantly cross-linking the resin (i.e., cross-linking less than about 5% of the resin) or significantly decomposing the polymeric nano-particles (i.e., decomposing less than about 0.5% of the polymeric nano-particles); and (3) performing a hybridization bake at a sufficiently high temperature to cross-link the resin (i.e., cross-link at least about 90% of the resin) without significantly decomposing any significant quantity of the polymeric nano-particles (i.e., decomposing less than about 5% of the polymeric nano-particles) to form dielectric layer 110.

In a first example, polymeric nano-particles comprise at least about 10% by weight of all dielectric layer 110 solids after prebake. In a second example, polymeric nano-particles comprise no more than about 65% by weight of all dielectric layer 110 solids after prebake.

The temperature of the hybridization bake is higher than the temperature of the prebake. In one example the prebake temperature is between about 80° C. and about 100° C. In one example, the hybridization bake temperature is equal to or less than about 200° C. In a second example, the hybridization bake temperature is equal to or less than about 350° C. In one example, at least about 90% of the resin is cross-linked after the hybridization bake. In one example, no more than about 5% of the polymeric nano-particles have decomposed after the hybridization bake.

Formed on a top surface of dielectric layer 110 is a capping layer 115. Formed in substrate 100 is an exemplary contact 120. In one example, contact 120 is a stud contact to devices such as field effect and bipolar transistors, diodes, capacitors, resistors and inductors formed in substrate 100 that will be subsequently wired together to form an integrated circuit.

Suitable materials for barrier layer 105 and capping layer 115 include but are not limited to silicon dioxide ($SiO_2$), silicon nitride ($Si_3N_4$), silicon carbide (SiC), silicon oxy nitride (SiON), silicon oxy carbide (SiOC), carbon doped silica glass (SiCOH), plasma-enhanced silicon nitride ($PSiN_x$) or NBLok (SiC(N,H)). In one example, contact 120 comprises tungsten (W). In one example, either or both of barrier layer 105 and capping layer 115 are a barrier to the diffusion of copper (Cu).

Figure 1B:
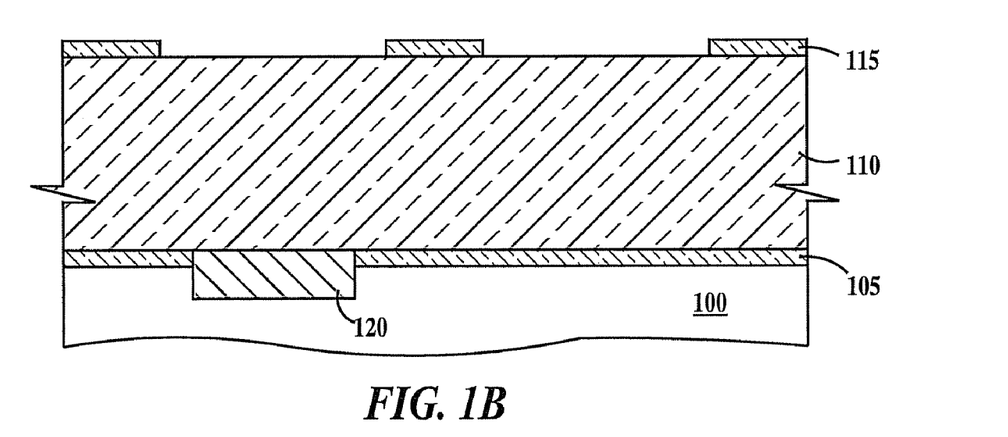

In FIG. 1B, a pattern is formed in capping layer 115, exposing dielectric layer 110 wherever the capping layer was removed. Patterning of capping layer 115 may be accomplished by forming a layer of photoresist over the capping layer, exposing the photoresist layer to actinic radiation through a patterned photomask, developing away exposed (in the case of positive resist) regions of the photoresist layer, reactive ion etching (RIE) the capping layer, and then removing the remaining photoresist layer.

Figure 1C:
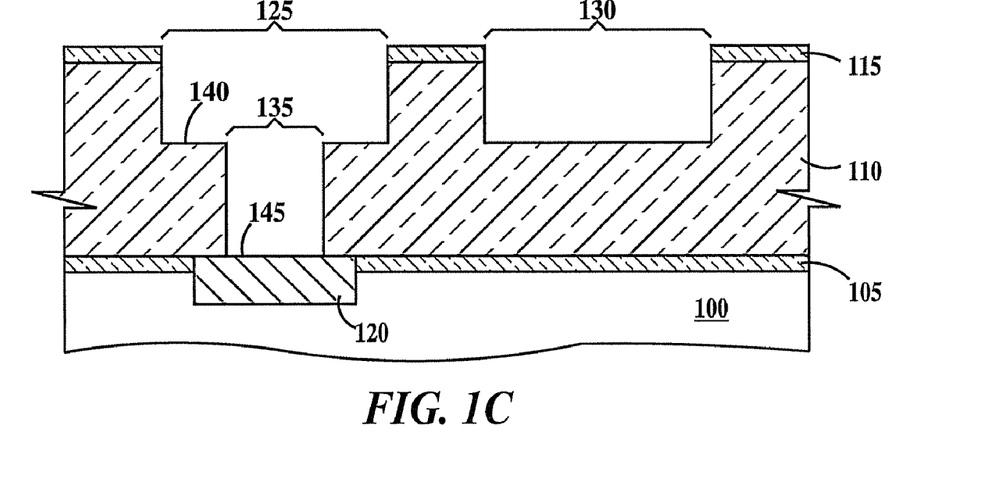

In FIG. 1C, multiple steps have been performed. First, trenches 125 and 130 have been formed (for example by RIE) into dielectric layer 110 using the pattern in capping layer 115 as a hardmask. Next a via 135 is formed in a bottom 140 of trench 125 exposing a top surface 145 of contact 120. Via 135 may be formed, for example, by a photolithographic process similar to that used to pattern capping layer 115 as described supra.

Figure 1D:
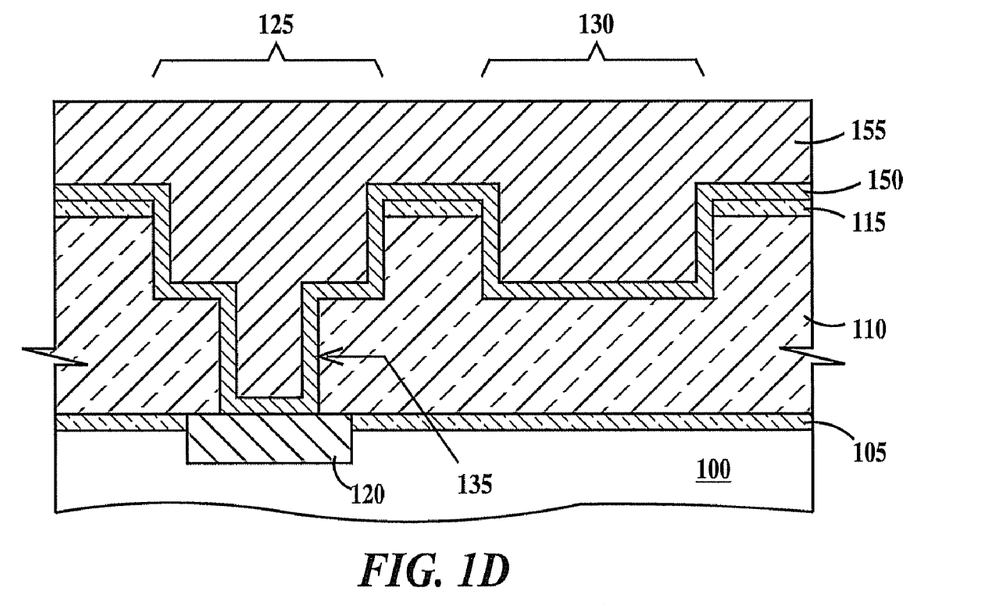

In FIG. 1D, an electrically conductive conformal layer (or liner) 150 is blanket deposited covering all exposed surfaces of trench 125, trench 130, via 135, capping layer 115 and contact 120. Next, an electrically conductive core conductor 155 is formed on top of liner 150 completely filling trenches 125, 130 and via 135.

In one example, liner 150 comprises a layer of Ta, TaN, Ti, TiN or combinations thereof. In one example, core conductor 155 comprises copper.

Figure 1E:
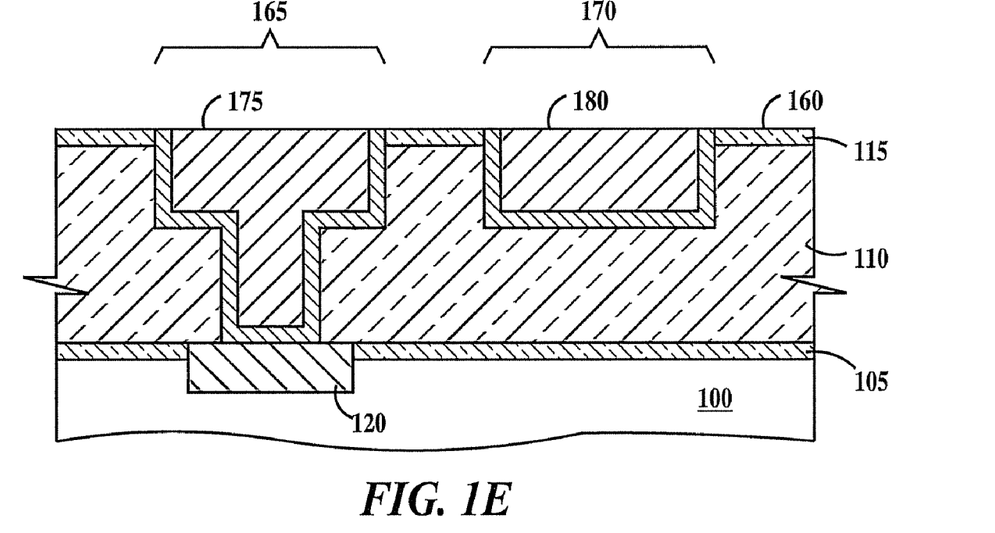

In FIG. 1E, a chemical-mechanical-polish (CMP) process is performed to remove all liner 150 and core conductor 155 from above a top surface 160 of capping layer 115 to form a dual-damascene wire 165 and a damascene wire 170. A top surface 175 of dual-damascene wire 165, a top surface 180 of damascene wire 170 and top surface 160 of capping layer 115 are rendered co-planar by the CMP process.

Figure 1F:
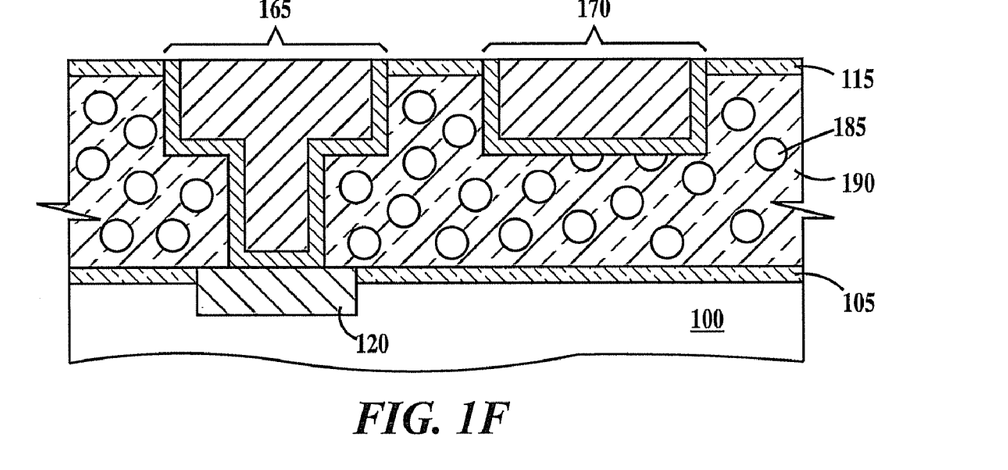

In FIG. 1F, a full-cure bake is performed. The full cure bake decomposes the polymeric nano-particles forming voids 185, thus converting dielectric layer 110 (see FIG. 1E) into a porous dielectric layer 190. The temperature of the full cure bake is higher than the temperature of the hybridization bake. In a first example, the full-cure bake temperature is between about 400° C. and about 435° C. Further cross-linking of the resin may occur during the full-cure bake. In a second example, the full-cure bake temperature is equal to or less than about 450° C. In one example, at least about 99.5% by weight of said polymeric nano-particles are decomposed by the full-cure bake. In one example, capping layer 115 is thin enough (after CMP) to allow diffusion of decomposition products (from the polymeric nano-particles) out of porous dielectric layer 190 through the capping layer.

While a dual damascene process is illustrated in FIGS. 1A through 1F, the embodiments of the present invention may be applied to single damascene processing as well. It is advantageous that any shrinkage occurring during the aforementioned hybridization and full-cure bakes be held to a minimum. In one example, a thickness of porous dielectric layer 190 is within about 5% of a thickness of dielectric layer 110 (see FIG. 1E). In one example, a thickness of porous dielectric layer 190 is within about 3.5% of a thickness of dielectric layer 110 (see FIG. 1E). In one example, a thickness of porous dielectric layer 190 is within about 2% of a thickness of dielectric layer 110 (see FIG. 1E).

FIGS. 2A through 2F are cross-section views illustrating fabrication of an interlevel dielectric wiring level in an integrated circuit according to a second embodiment the present invention.

Figure 2A:
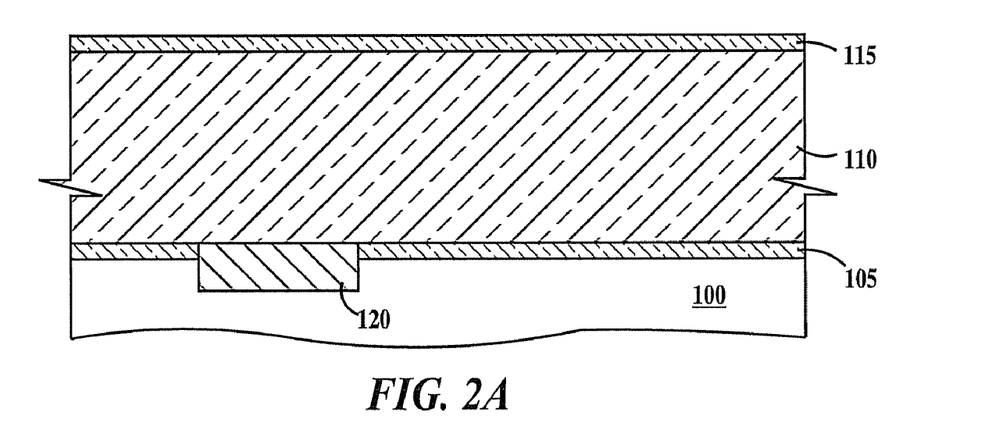
FIGS. 2A through 2F are cross-section views illustrating fabrication of an interlevel dielectric wiring level in an integrated circuit according to a second embodiment of the present invention.
Figure 2B:
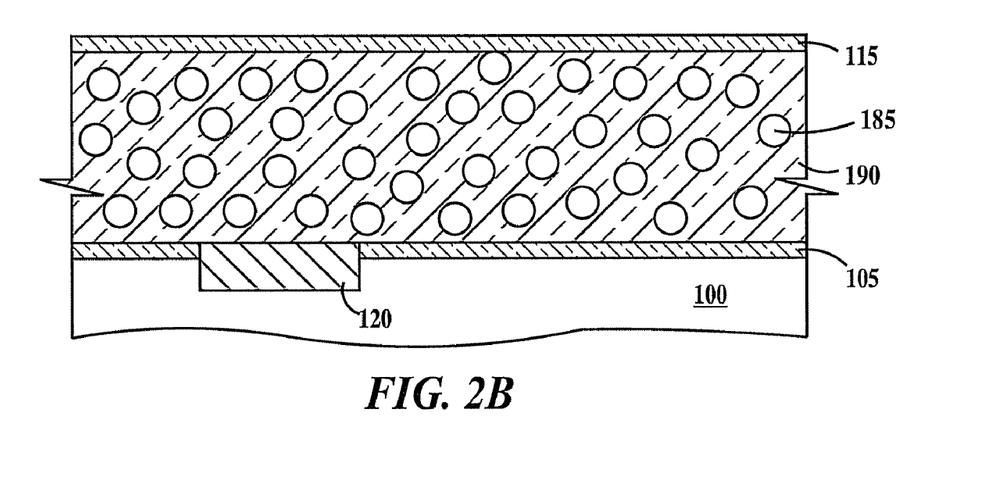
Figure 2C:
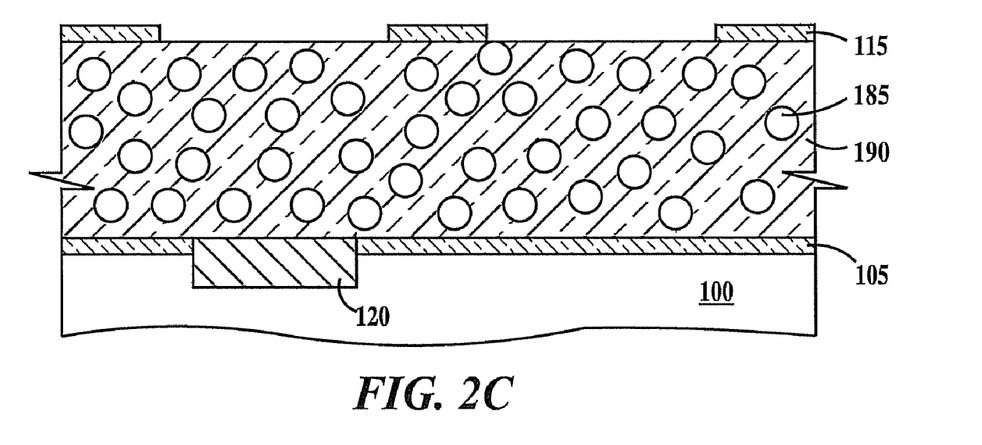
Figure 2D:
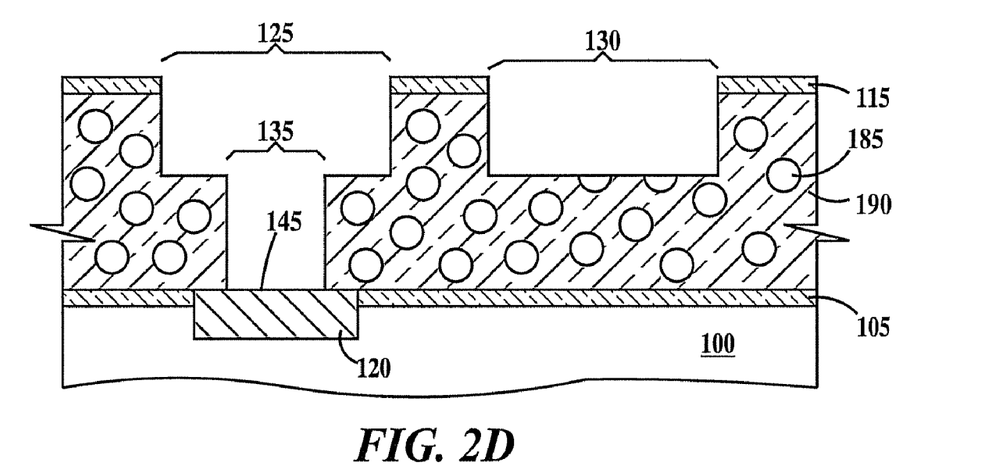
Figure 2E:
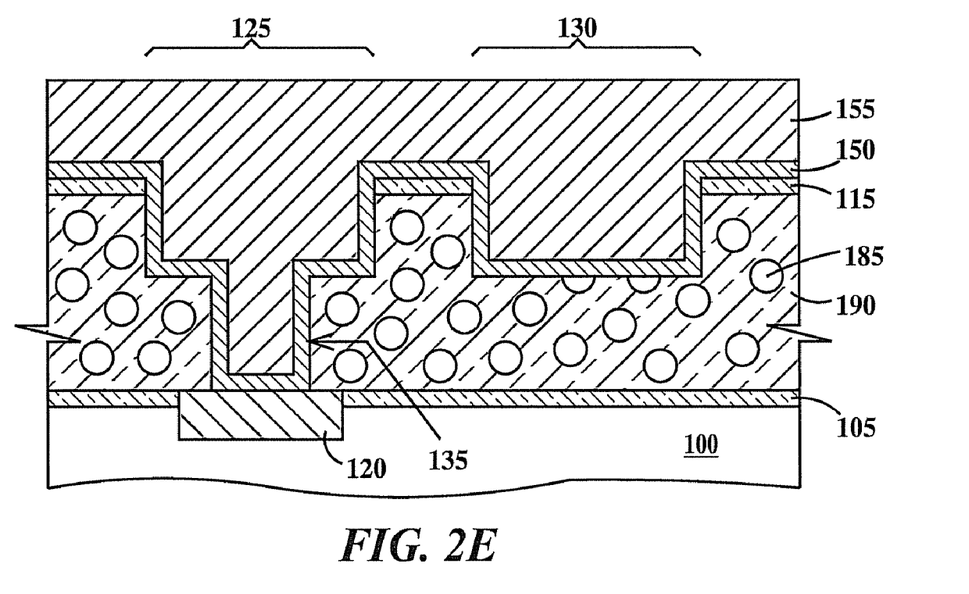
Figure 2F:
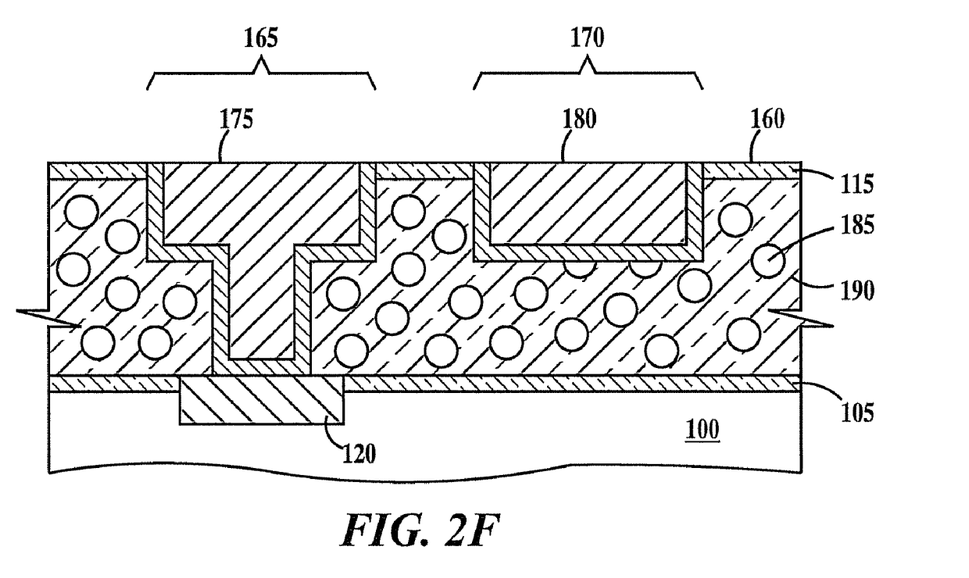

FIG. 2A is identical to FIG. 1A; however, FIG. 2B differs from FIG. 1B, in that not only has the hybridization bake been performed, but also the full-cure bake, so dielectric layer 110 (see FIG. 2A) is converted to porous dielectric layer 190. In the second embodiment of the present invention, the hybridization and full-cure bakes may be combined into a single bake. FIGS. 2C through 2F are similar to FIGS. 1C through 1F respectively, except dielectric layer 110 (see FIGS. 1C through 1F) is replaced with porous dielectric layer 190. FIG. 2F is identical to FIG. 1F.

Figure 3:
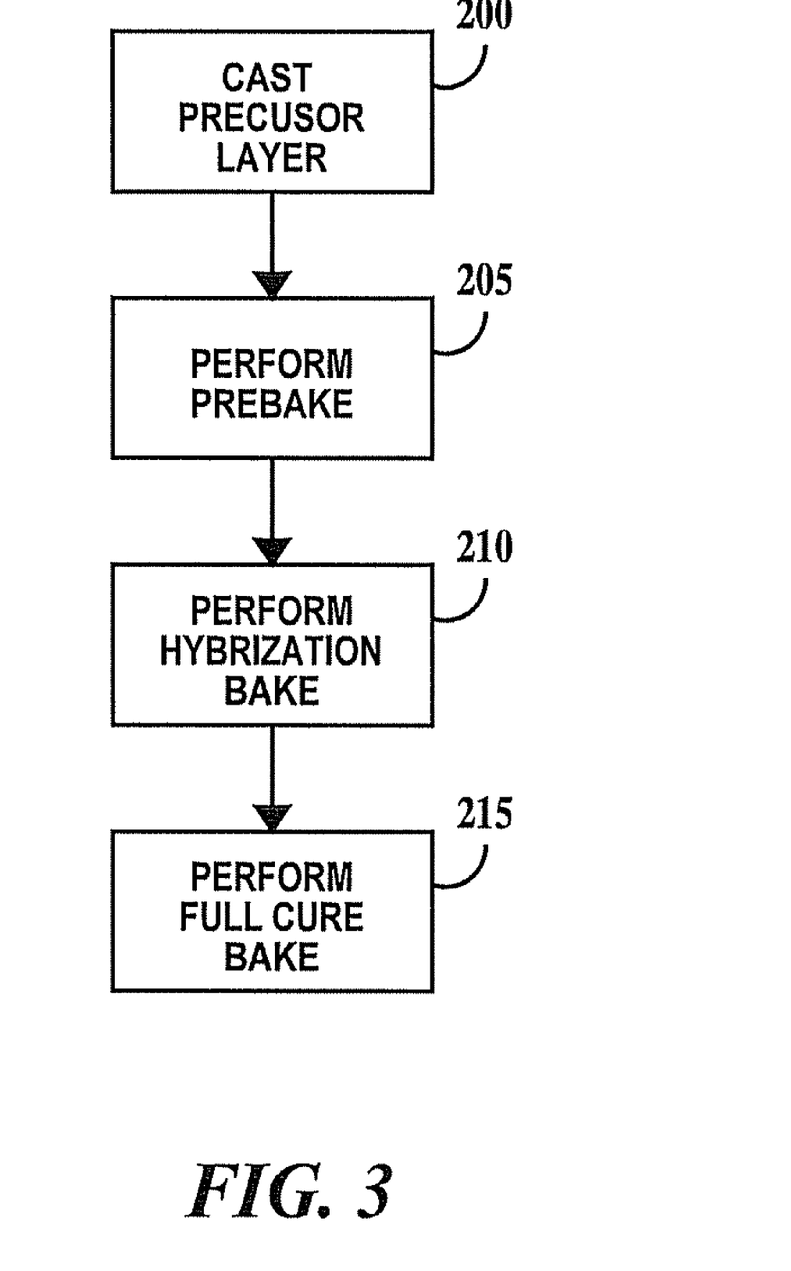
FIG. 3 is a flowchart of the porous dielectric material formation steps according to certain embodiments of the present invention.

FIG. 3 is a flowchart of the porous dielectric material formation steps according to certain embodiments of the present invention. In step 200, a precursor layer is formed on a substrate. The precursor layer includes a resin and polymeric nano-particles dispersed in the resin, wherein each polymeric nano-particle comprises a multi-arm core polymer and pendent polymers that are attached to the multi-arm core polymer as described infra. The multi-arm core polymer is immiscible with the resin and the pendent shell polymers are miscible with the resin and a casting solvent.

In step 205, the precursor layer is heated (pre-baked) to a first temperature. The first temperature is high enough to drive the casting solvent out of the precursor layer without decomposing significant amounts of the polymeric nano-particles (i.e., without decomposing more than about 0.5% of the polymeric nano-particles), thus forming a pre-baked precursor layer. In one example, the first temperature is between about 80° C. and about 100° C., and the precursor layer is held at the first temperature for about 1 to about 15 minutes.

In step 210, the pre-baked precursor layer is heated (hybridization baked) to a second temperature. The second temperature is high enough to cross-link the resin (for example, to cross-link at least about 90% of the resin oligomers) without significantly decomposing the polymeric nano-particles (i.e., without decomposing more than about 5% of the polymeric nano-particles), thereby converting the pre-baked precursor layer to a dielectric layer. The second temperature is higher than the first temperature. In a first example, the second temperature is equal to or less than about 200° C. In a second example, the second temperature is equal to or less than about 300° C. In a third example, the second temperature is less than about 400° C. In one example, the pre-baked precursor layer is held at the second temperature for between about 1 minute and about 60 minutes.

In step 215, the dielectric layer is heated to a third temperature. In one example, the third temperature is high enough to thermally decompose about 99.5% or more of the original quantity of the polymeric nano-particles in the precursor layer into decomposition products and to drive the decomposition products out of the dielectric layer, thereby creating voids in the dielectric layer and converting the dielectric layer to a porous dielectric layer. In a second example, the third temperature is high enough to thermally decompose about 99.5% or more of the polymeric nano-particles (remaining in the dielectric layer after treatment at the second temperature) into decomposition products and to drive the decomposition products out of the dielectric layer, thereby creating voids in the dielectric layer and converting the dielectric layer to a porous dielectric layer. The third temperature is higher than the second temperature. In a first example, the third temperature is between about 400° C. and about 435° C. In a second example, the third temperature is equal to or less than about 450° C. In one example the dielectric layer is held at the third temperature for between about 15 minutes and about 120 minutes.

The polymeric nano-particles of the embodiments of the present invention are advantageously comprised of a polystyrene or substituted polystyrene core having multiple polystyrene branches, some or all of the polystyrene branches terminating in pendent oligomers selected from the group consisting of linear poly(alkyleneglycol), poly(alkylene glycol methacrylate), poly(methyl methacrylate), poly(acrylamide), poly(methacrylamide) and combinations thereof. Branches not terminating in a pendent polymer group are terminated with a hydroxyl or protected hydroxyl group. Structure (I) illustrates an exemplary polymeric nano-particle comprising a polystyrene multi-arm core polymer with polystyrene arms terminating with linear polyethylene glycol polymers (PS-PEG). While eight arms are illustrated in structure I, there may be a larger number of arms, for example, 20 to 50 or more arms. The PEG shell is an oligomer or polymer with a degree of polymerization ranging from 2 to 40.

STRUCTURE I

Structure (II) illustrates an exemplary polymeric nanoparticle comprising a polystyrene multi-arm core polymer with polystyrene branches terminating with polyethylene glycol methacrylate polymers (PS-PEGM). While eight arms are illustrated in structure II, there may be a larger number of arms, for example, 20 to 50 or more arms.

STRUCTURE III

STRUCTURE II

The polystyrene core (the circle in structures I and II) is illustrated in structure (III).

The cross-linked core of each molecule is small (less than about 3 wt %) of the total polymer and is composed of cross-linked structures derived from divinyl benzene or other related polyfunctional olefinically substituted benzene, napththalene or polynuclear aromatics. The cross-linked central core constitutes less than about 5 mole % of the polymer and serves mainly as a multifunctional site for growing polymer arms.

The synthesis of structure (I) is believed to be depictable as follows:

The synthesis of structure (II) is believed to be depictable as follows:

Suitable resins (after cross-linking) include organosilicate resins are represented by structures (IV), (V), (VI) and (VII).

(IV)

-continued (V)

(VI)

(VII)

wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms.

Resin structure (IV) may be represented by the formula —(SiO$_2$)n-, resin structure (V) may be represented by the formula —(R'SiO$_{3/2}$)n-, resin structure (VI) may be represented by the formula —(R'$_2$SiO)n- and resin structure (V) may be represented by the formula —(R"Si$_2$O$_3$)n-. The precursor material for resin structure (IV) has the formula Si(OR)$_4$, the precursor material for resin structure (V) has the formula SiR'(OR)$_3$, the precursor material for resin structure (VI) has the formula SiR'R"(OR)$_2$ and the precursor material for resin structure (VII) has the formula (RO)$_3$Si—R'"—Si(OR)$_3$, wherein R is selected from the group consisting of an alkyl group having 1 to 3 carbon atoms and a cycloalkyl group having 6 to 12 carbon atoms, and wherein R'" is selected from the group consisting of an alkylene group having 1 to 3 carbon atoms and a cycloalkylene group having 6 to 12 carbon atoms.

The actual resins used in compositions according to the embodiments of present invention include polymers having a range of molecular weights and may include precursor materials. After full-cure bake, further cross-linking may take place.

The polymeric nano-particles and resin may be dissolved in a casting solvent. The solvent may be selected from the group consisting of propylene glycol mono-alkyl ether alcohols, propylene glycol dialkyl ethers, propylene glycol mono-alkyl ether acetates, xylenes, alkanols having 1-6 carbon atoms, ketones having 3-8 carbon atoms, and cyclic ketones having 5-6 carbon atoms. The multi-arm core polymer (polystyrene) is advantageously immiscible with the resin while the branch terminating pendent polymers (linear polyethylene glycol, polyethylene glycol methacrylate, polymethacrylate, polyacrylamide, polymethacrylamide, poly hydroxyethyl methacrylate) is advantageously miscible with the resin prior to vitrification. This helps keep the polymeric nano-particles suspended in the resin.

PREPARATION EXAMPLES

Example 1

Preparation of Hydroxyl Terminated Polystyrene Multi-Arm Core Polymers

To a vigorously stirred solution of distilled styrene, anhydrous tetrahydrofuran (THF) in cyclohexane, was added 3-(t-butyldimethylsilyloxy)-1-propyllithium. The orange color solution was stirred for 30 minutes and the 'living' polystyrene in solution was characterized by withdrawing an aliquot to be quenched and precipitated from methanol. To the remaining reactants, p-divinylbenzene was added to generate polystyrene multi-arm core polymers, which contain a small cross-linked core and multiple eminating arms of poly(styrene). The dark red solution was stirred for 30 minutes, then quenched and precipitated into methanol. Colorless product was collected and dissolved in THF and re-precipitated into methanol.

Example 2

Preparation of Polystyrene Core/PEG Methacrylate Polymeric Nano-Particles

To a stirring solution of hydroxyl terminated polystyrene multi-arm core polymers, triethylamine and dimethylaminopyridine dissolved in dichloromethane, a solution of bromoisobutyryl bromide in dichloromethane was added at 0° C. The mixture was stirred for 30 minutes at room temperature, then refluxed for 2 hours. Product was precipitated into methanol multiple times to obtain pure multi-arm core polymer initiator.

The above star initiator was combined with poly(ethylene glycol) monomethylether monomethacrylate (Molecular Weight 500) and toluene with efficient stirring in a Schlenk flask. The viscous solution was degassed repeatedly by freeze, pump, and thaw cycles. A catalyst dibromobis(triphenylphosphine)nickel (II) was added under positive nitrogen flow and the mixture was heated to 90° C. for 14 hours. The crude mixture was precipitated into hexane to yield a slimy green product. After decanting off the solvent, the crude product was dissolved in dichloromethane/THF mixture (50:50 by weight) and passed through a short column of aluminum oxide to remove the catalyst. Final precipitation from dichloromethane into hexane provided PEG-methacrylate functionalized polystyrene polymer nano-particles.

Example 3

Preparation of Polystyrene Core/Linear PEG Polymeric Nano-Particles

Anhydrous linear polyethylene glycol monomethylether was obtained by refluxing a sample of commercial starting material in a benzene solution with a Dean-Stark apparatus. The solvent was removed under reduced pressure and replaced with anhydrous THF. N-butyl lithium was added drop wise at 10° C. with vigorous stiffing. The solution was stirred at room temperature for 2 hours followed by addition of p-toluenesulfonyl chloride in THF. This mixture was stirred for 16 hours at room temperature and then at 50° C. for 4 hours. The reaction was quenched with methanol and concentrated under vacuum. Crude product was passed through a column of neutral alumina with THF as the elution solvent. After removal of solvent, the product was re-crystallized from an ethanol/isopropanol mixture and filtered with a pre-chilled fritted funnel. The colorless solid was transferred to a round bottom flask attached to a Kugelrohr under high vacuum at 65° C. to remove any residual solvent and water.

To a suspension of potassium hydride, pre-washed with pentane and suspended in anhydrous THF, a solution of hydroxyl terminated polystyrene multi-arm core polymer dissolved in anhydrous THF was added slowly. This mixture was stirred at 50° C. for 2 hours, cooled to room temperature, followed by the addition of PEG-tosylate in THF. The reaction mixture was stirred at 70° C. for 16 hours. After cooling to room temperature, a small amount of ethanol was added and the mixture was concentrated slightly under reduced pressure. Dimethylformamide was added and transferred into a dialysis bag having the appropriate molecular weight cut off for the removal of un-reacted LPEG-tosylate. The product was dialyzed against distilled water, methanol, and dichloromethane sequentially. After removal of solvent the gummy product was dissolved in a small amount of acetonitrile and isopropanol was added until a tacky solid was precipitated out of the solution. Final product was isolated and dried under vacuum.

Experimental Results

Figure 4:
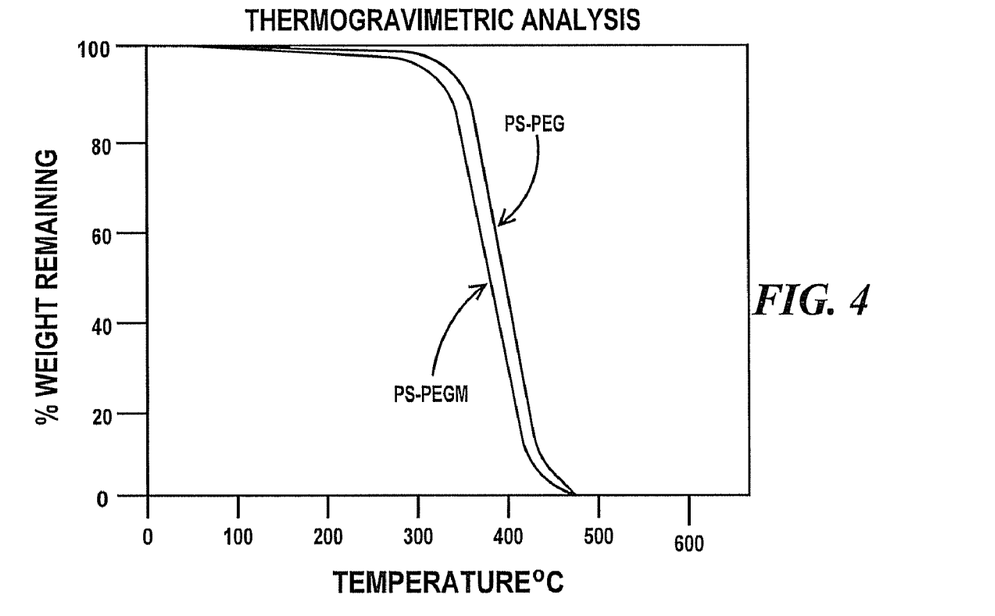
FIG. 4 is a thermo-gravimetric analysis plot of percent weight remaining of porogen material versus temperature according to embodiments of the present invention.

FIG. 4 is a thermo-gravimetric analysis plot of percent weight remaining of porogen material versus temperature according to embodiments of the present invention. Samples of both porogens, polystyrene multi-arm core polymer with polystyrene branches terminating with linear polyethylene glycol polymers (PS-PEG) and polymeric polystyrene multi-arm core polymer with polystyrene branches terminating with polyethylene glycol methacrylate polymers (PS-PEGM) prepared supra, were subjected to thermogravimetric analysis at a heating rate of about 10° C./minute under nitrogen. At about 100° C., less than 0.5% of the porogens has decomposed. Above about 200° C., both porogens decompose marginally and the decomposition rate greatly accelerates above about 300° C. At 300° C. no more than about 5% of the porogens are decomposed. About 99.5% of the porogens are decomposed at just under about 450° C. Both porogens exhibit no residue upon heating higher than 450° C.

However, the polystyrene multi-arm core polymer with polystyrene branches terminating with linear polyethylene glycol polymers (PS-PEG) porogen exhibits slightly steeper decomposition rate characteristics with the onset of rapid decomposition, being shifted to higher temperatures. Aside from the difference in decomposition onset, both porogens exhibit an extremely narrow decomposition temperature window, which is highly desirable.

Figure 5:
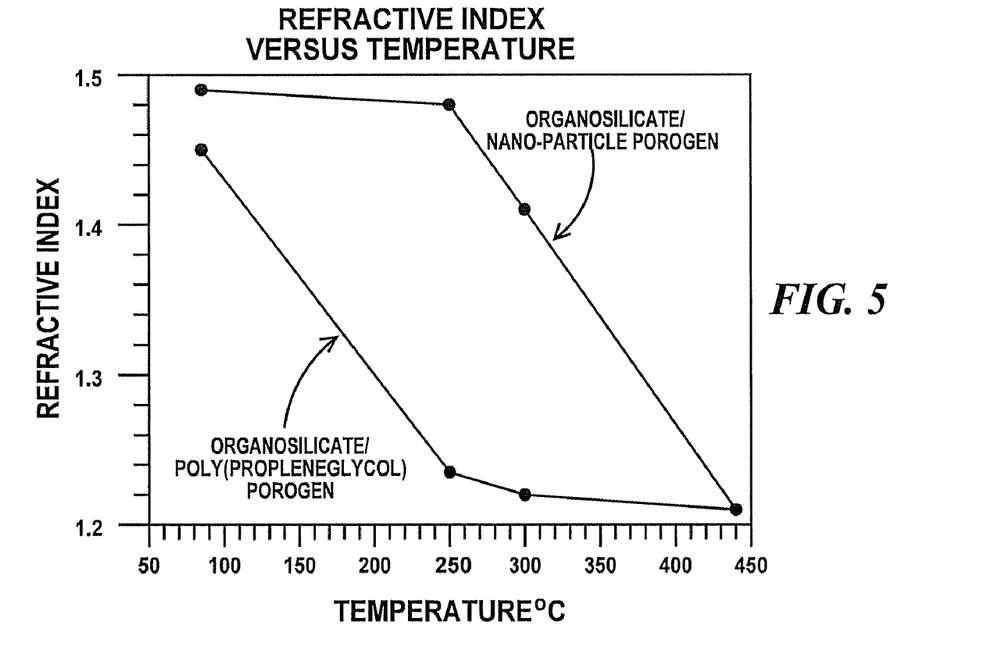
FIG. 5 is a plot of refractive index versus temperature of materials used for forming a porous interlevel dielectric layer according to embodiments of the present invention.

FIG. 5 is a plot of refractive index versus temperature of materials used for forming a porous interlevel dielectric layer according to embodiments of the present invention. A first porogen/resin mixture was formulated with about 44.2 percent by volume of the polystyrene multi-arm core polymer with polystyrene branches terminating with linear polyethylene glycol polymers (PS-PEG) porogen and about 55.8 percent by volume of a commercial organosilicate resin manufactured by JSR Corporation, Tokyo, Japan. This mixture was spin-coated on wafers and different samples heated to the several temperatures indicated in FIG. 5. As a control, a simple, linear polypropylene glycol polymer (PPG) (not a polymeric nano-particle) was formulated identical to the above example in organo silicate resin and spin-coated on wafers and different samples heated to the several temperatures indicated in FIG. 5. The starting refractive index of the organosilicate/porogen mixture was about 1.49 at about 80° C., at which temperature most volatile solvents present would be driven off and declined to about 1.48 at about 250° C., at which temperature the resins cross-links (vitrifies), so the slight decrease in refractive index between about 80° C. and about 250° C. may be attributed to the loss of solvent and cross-linking. The starting refractive index of the PPG polymer was about 1.45 at about 80° C. and declined to about 1.23 at about 250° C. (roughly the hybridization temperature), indicating decomposition of the PPG polymer. The refractive index of the organosilicate resin/porogen mixture was about 1.41 at about 300° C. indicating onset of decomposition of the porogen and about 1.21 at about 450° C. (roughly the full-cure temperature) indicating a porous dielectric layer had been formed.

A second porogen/resin mixture was formulated with about 37.5 percent by volume of the polystyrene multi-arm core polymer with polystyrene branches terminating with linear polyethylene glycol polymers (PS-PEG) porogen and about 62.5 percent by volume of the organosilicate matrix resin. This mixture was spin-coated on wafers and different samples heated to the several hybridization/full-cure temperature combinations indicated in Table I, and the refractive index and thickness of the layer after heating was measured. Full-cure temperature ranged from about 400° C. to about 435° C.

TABLE I

| Hybridization Bake Temperature | Refractive Index after Hybrid Bake | Refractive Index after Full Cure Bake | Thickness after Hybrid Bake (nm) | Thickness after Full Cure Bake (nm) |
|---|---|---|---|---|
| 225° C. | 1.479 | 1.190 | 807 | 824 |
| 245° C. | 1.478 | 1.187 | 803 | 825 |
| 265° C. | 1.475 | 1.193 | 809 | 823 |
| 295° C. | 1.465 | 1.196 | 770 | 775 |
| 320° C. | 1.472 | 1.201 | 817 | 824 |
| 345° C. | 1.460 | 1.200 | 821 | 823 |

Considering the hybridization temperatures ranges from 225° C. to 345° C. and comparing the refractive index after hybridization and full cure, a very small decrease in refractive index is observed for the after hybrid bake samples with increasing hybridization temperature. This is commensurate with higher degrees of condensation in the organosilicate resin, since the refractive index in the fully cured (porous) state is relatively constant. At temperatures exceeding 300° C., the decreasing hybrid state refractive index is accompanied by a slight increase in the refractive index for the fully cured material. This would be consistent with low degrees of porogen decomposition at the higher hybridization temperatures and may reflect the detrimental effect of the presence of small amounts of oxygen during the hybridization bake. Oxygen contamination will decrease the stability of poly(alkylene oxides) and may accelerate the decomposition of the poly (ethylene glycol) chain ends. Nevertheless, this slight increase in the refractive index and hence the dielectric constant is negligible.

More important is the comparison of the coating thickness after hybridization and final cure. A control polymer (PPG)/resin mixture was formulated and compared with the second porogen/resin mixture described supra. The two mixtures were spin-coated on different wafers. Different samples were heated to the two hybridization/full-cure temperature combinations indicated in Table II, and the percent shrinkage in coating thickness was measured. Full-cure temperature was about 400° C. to about 435° C.

TABLE II

| Mixture | Percent Shrinkage After 250° C. Hybrid Bake | Percent Shrinkage After 300° C. Hybrid Bake | Total Percent Shrinkage After Full Cure Bake | Delta Percent Shrinkage Between Hybrid and Full Cure Bakes |
|---|---|---|---|---|
| Organosilicate/PPG | 10.1 | | 13.6 | 3.5 |
| Organosilicate/PPG | | 10.2 | 12.7 | 2.5 |
| Organosilicate/Polymeric Porogen Nano-particle | 7.2 | | 6.5 | 0.7 |
| Organosilicate/Polymeric Porogen Nano-particle | | 8.4 | 9.9 | 1.5 |

Shrinkage (defined in terms of a reduction in thickness) ranged from about 3.5% to about 0.7%. The shrinkage of the organosilicate resin/polymeric porogen nano-particle mixture was significantly less than the organosilicate resin/PPG control mixture after hybridization bake. The shrinkage of the organosilicate resin/polymeric porogen nano-particle mixture was significantly less than the organosilicate resin/PPG control mixture after full-cure bake. The shrinkage of the organosilicate resin/polymeric porogen nano-particle mixture between hybridization bake and full cure bake was significantly less than the shrinkage of the organosilicate resin/PPG control mixture. This data indicate the embodiments of the present invention provide a relatively thermally and dimensionally stable porous dielectric material, which shows little change in film thickness in going from the nano-hybrid state to the porous film.

Additional mechanical properties of dielectric layers formed from porogen/resin mixtures according to embodiments of the present invention are given in Table III. All resins were organo silsesquioxane, $RSiO_{1.5}$, homo and copolymers silicate resins.

TABLE III

| Porogen/Resin Mixture 50% by Weight Porogen 50% by Weight Resin | Young's Modulus (GPa) | Hardness (GPa) |
|---|---|---|
| Porogen/Resin 1 After 250° C. Hybridization Bake | 3.6 | 0.19 |
| Porogen/Resin 1 After 450° C. Full Cure Bake | 0.8 | 0.11 |
| Porogen/Resin 2 After 250° C. Hybridization Bake | 5.2 | 0.26 |
| Porogen/Resin 2 After 450° C. Full Cure Bake | 0.8 | 0.11 |
| Porogen/Resin 3 After 250° C. Hybridization Bake | 6.4 | 0.42 |
| Porogen/Resin 3 After 450° C. Full Cure Bake | 0.8 | 0.11 |

Because of the high Young's modulus after the hybridization bake, the compositions of the embodiments of the present invention provide a relatively stiff material that is well suited for use in fabrication of interlevel dielectric layers (ILD) for damascene integrated circuit fabrication when the porosity is introduced after the metal CMP as described supra. Such a process leads to minimal film shrinkage upon generation of porosity. This feature becomes more critical as the number of simultaneously processed layers increases.

The polymeric nano-particles as described in the various embodiments of the present invention may be advantageously be radical block copolymers with less than about 5 mole % of bi-functional cross-linking reagents with very low cross-linking, levels with the cross-linking localized near the center of the particle. This structure allows efficient and clean (with little char residue) decomposition of the polymeric nano-particles, high decomposition temperatures and foaming efficiencies in excess of 90%. The low level of and localized cross-linking and the block copolymer nature of the polymeric nano-particles of the embodiments of the present invention distinguishes these materials from micro-emulsion particles prepared by top-down procedures. The inner core of the polymeric nano-particle, being comprised of styrene or alkyl substituted styrenes, is highly incompatible with the matrix (organosilicate) resin and delivers high thermal stability. The high thermal stability allows the matrix to be cured to higher temperatures, resulting in higher vitrification levels. This leads to very low shrinkage when converting the cured matrix to a porous dielectric. Additionally, the low cross-link density of the nanoparticles minimizes char upon decomposition, yielding optimum permittivity values.

The compositions and the embodiments of the present invention are useful for both (1) fabrication of interlevel dielectric layers (ILD) for damascene integrated circuit fabrication where trenches and vias are etched in the non-porous (hybrid) dielectric material, metal is deposited and planarized, and the porosity then generated, as well as for (2) fabrication of ILD for damascene integrated circuit fabrication when the porosity is introduced before trench formation, providing improved dimensional control and lower film stresses because of reduced shrinkage. In both applications, the high thermal stability of the nano-particles porogens is advantageous because it increases pore forming efficiency (foaming efficiency).

In the porosity after metallization process, several wiring levels may be fabricated with hybridization baked only dielectric layers and porosity may be generated in the dielectric layers of the several wiring levels by full cure baking the several wiring levels simultaneously.

Thus, the embodiments of the present invention provide an insulating material with high strength during mechanical processing, very low film shrinkage during pore formation, and a low dielectric constant after pore formation, and is thus easily integrated into conventional integrated circuit fabrication processes.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A composition, comprising:
a resin;
polymeric nano-particles dispersed in said resin, each said polymeric nano-particle comprising a multi-arm core polymer and pendent polymers attached to said multi-arm core polymer, said multi-arm core polymer immiscible with said resin and said pendent polymers miscible with said resin; and
a solvent, said solvent volatile at a first temperature, said resin cross-linkable at a second temperature, said polymeric nano-particle decomposable at a third temperature, said third temperature higher than said second temperature, said second temperature higher than said first temperature.

2. The composition of claim 1, wherein said polymeric nano-particles comprise between about 10% by weight and about 65% by weight of all solids in said composition.

3. The composition of claim 1, wherein said polymeric nano-particles are thermally stable to at least about 200° C.

4. The composition of claim 1, wherein said polymeric nano-particles thermally decompose at a temperature below about 450° C.

5. The composition of claim 1, wherein said polymeric nano-particles thermally decompose between about 200° C. and about 450° C.

6. The composition of claim 1, wherein said multi-arm core polymer of each said polymeric nano-particle comprises a polystyrene or substituted polystyrene star molecule having multiple polystyrene branches, each branch terminating in either one of said pendent polymers or a hydroxyl group.

7. The composition of claim 1, wherein said pendent polymers are selected from the group consisting of linear poly(alkyleneglycol), poly(alkylene glycol methacrylate), poly(methyl methacrylate), poly(acrylamide), poly(methacrylamide), poly(hydroxyethyl methacrylate) and combinations thereof.

8. The composition of claim 1, wherein said resin comprises —(SiO$_2$)$_n$—, —(R'SiO$_{3/2}$)$_n$—, —(R'$_2$SiO)$_n$— or —(R"Si$_2$O$_3$)$_n$—, wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms.

9. The composition of claim 1, wherein said thickness of said layer of said composition shrinks by less than about 2% between heating said layer from said second temperature to said third temperature.

10. The composition of claim 1, wherein said polymeric nano-particles comprises a polystyrene multi-arm core polymer with each polystyrene arm terminated with a linear polyethylene glycol polymer.

11. The composition of claim 10, wherein the core of said polystyrene core polymer is a cross-linked polymer of the structure:

where X is between 4 and 50.

12. The composition of claim 10, wherein herein the core of said polystyrene core polymer comprises a material selected from the group consisting of cross-linked structures derived from divinyl benzene, cross-linked structures derived from polyfunctional olefinically substituted benzene, cross-linked structures derived from naphthalene, and cross-linked structures derived from polynuclear aromatic compounds.

13. The composition of claim 1, wherein said polymeric nano-particles thermally decompose at a temperature between about 400° C. and about 450° C.

14. The composition of claim 1, wherein said polymeric nano-particles comprises a polystyrene multi-arm core polymer with each polystyrene arm terminated with a linear polyethylene glycol methacrylate polymer.

15. The composition of claim 14, wherein said polystyrene core polymer has the structure:

where X is between 4 and 50.

16. The composition of claim 14, wherein herein the core of said polystyrene core polymer comprises a material selected from the group consisting of cross-linked structures derived from divinyl benzene, cross-linked structures derived from polyfunctional olefinically substituted benzene, cross-linked structures derived from naphthalene, and cross-linked structures derived from polynuclear aromatic compounds.

17. The composition of claim 1, wherein said resin has the structure:

18. The composition of claim 1, wherein said resin has the structure:

and wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms.

19. The composition of claim 1, wherein said resin has the structure:

and wherein R' is selected from the group consisting of an alkyl group having 1 to 3 carbon atoms, an aryl group having 6 to 12 carbon atoms, and a cycloalkyl group having 6 to 12 carbon atoms, and wherein R" is selected from the group consisting of an alkylene group having 1 to 2 carbon atoms and a cycloalkylene group having 6 to 12 carbon atoms.

20. The composition of claim 1, wherein a thickness of a layer of said composition shrinks by less than about 3.5% between heating said layer from said second temperature to said third temperature.

* * * * *